United States Patent [19]

Ogman

[11] Patent Number: 4,702,960
[45] Date of Patent: Oct. 27, 1987

[54] SURFACE TREATMENT FOR CARBON AND PRODUCT

[75] Inventor: Abraham O. Ogman, Peabody, Mass.

[73] Assignee: Avco Corporation, Providence, R.I.

[21] Appl. No.: 173,772

[22] Filed: Jul. 30, 1980

[51] Int. Cl.[4] .......................... B32B 9/00; D02G 3/00
[52] U.S. Cl. .................................... 428/367; 427/249;
427/255.2; 427/397.7; 428/368; 428/401;
428/408; 428/446
[58] Field of Search ..................... 427/249, 255, 255.1,
427/255.2, 314, 444, 419.7, 402, 397.7; 428/367,
368, 408, 446, 448, 215, 401, 336, 373, 375

[56] References Cited

U.S. PATENT DOCUMENTS 3,391,016 7/1968 McCrary et al. ................... 427/249
4,068,037 1/1978 Debolt et al. ....................... 427/255
4,194,028 3/1980 Sirtl et al. ............................ 427/249

FOREIGN PATENT DOCUMENTS 2131407 1/1973 Fed. Rep. of Germany ...... 427/249
955700 4/1964 United Kingdom ................ 427/249
268969 7/1970 U.S.S.R. ............................. 427/249

*Primary Examiner*—Sadie L. Childs
*Attorney, Agent, or Firm*—Abraham Ogman

[57] ABSTRACT

The invention relates to a surface treatment for a carbon surface. A carbon-rich silicon carbide layer is applied over the carbon surface. The ratio of silicon to carbon in the carbon-rich layer varies from zero at the carbon surface interface to greater than zero and preferably 0.3 to 0.5 on the surface of the carbon-rich layer remote from the interface. A preferred method of making the silicon carbide layer is also presented.

2 Claims, 3 Drawing Figures

SURFACE TREATMENT FOR CARBON AND PRODUCT

BACKGROUND OF THE INVENTION

This invention relates generally to the treatment of the surface of carbon materials for the purpose of improving the bond (shear strength) between the carbon and a proposed matrix material. The invention is applicable to carbon surfaces of all shapes and sizes. It is particularly important for filaments, multifilament tows, thin strips, and the like (hereinafter referred to as carbon fibers). The following discussion is directed to treating filaments as a typical example.

One of the prevailing problems in the field of carbon-reinforced composites is the bond or shear strength between a carbon reinforcement and a matrix material. The problem exists whether the matrix is a plastic resin or a metal matrix. Historically, it has been very difficult to create a tenacious bond because carbon surfaces are not easily wetted by the common matrix materials in use or proposed. Further, in some cases, the carbon surface reacts with the matrix material.

A large number of surface treatments or wetting agents have been proposed. A process for modifying the surface characteristics of carbonaceous fibrous material using molecular oxygen is described in U.S. Pat. No. 3,754,947. U.S. Pat. No. 3,989,802 describes a process for treating carbon fibers with sodium dichromate and sulfuric acid. Boron and boron compounds are widely-used treatments for carbon fibers. One form of such treatment is described in U.S. Pat. No. 3,672,936. Oxygen gas, in combination with radio frequency, is proposed for a treatment for carbon fibers in U.S. Pat. No. 3,634,220. The list is extensive. Specifically, in connection with metal matrices, carbon fibers have been treated with titanium carbide, silicon carbide, and boron carbide.

It is an object of the present invention to provide a specific form of a silicon carbide treatment for a carbon surface.

It is another object of the invention to provide a carbon-rich silicon carbide treatment for a carbon surface.

It is yet another object of the invention to form a carbon-rich layer on a carbon surface wherein the percentage of silicon to carbon varies from zero at the carbon surface and increases towards one at the exterior surface of the carbon-rich layer.

It is still another object of the invention to disclose a vapor deposition process for depositing a carbon-rich layer on a carbon surface for the purpose of improving the sheer strength of the carbon material relative to a matrix material.

It is hypothesized that silicon carbide is particularly sensitive to the presence of non-stoichiometric silicon carbide or impurities. I. T. Kendall, *Journal of Chemical Physics*, Vol. 21, pg. 821 (1953). Since both Kendall and K. Arnt & E. Hausmanne in *Zeits Anorg Chem.*, Vol. 215, pg. 66 (1933) have found no evidence of non-stoichiometric silicon carbide, it is hypothesized that the excess carbon appears in the silicon carbide as an impurity. The properties of silicon carbide are particularly sensitive to the presence of impurities such as carbon.

Though the precise structure of carbon-rich silicon carbide may not be known with certainty, regions where quantitatively there is an excess of carbon have been observed. It is also theorized that some of the silicon also occurs in a free state.

The novel features that are considered characteristic of the invention are set forth in the appended claims; the invention itself, however, both as to its organization and method of operation, together with additional objects and advantages thereof, will best be understood from the following description of a specific embodiment, when read in conjunction with the accompanying drawings, in which:

DESCRIPTION OF THE INVENTION

Figure 1:
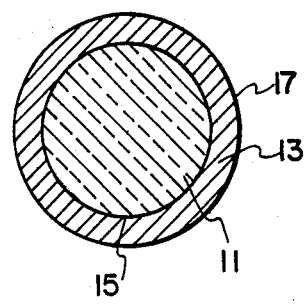
FIG. 1 is a cross-sectional representation of a carbon fiber containing a surface layer of carbon-rich silicon carbide embodying the principles of the present invention.
Figure 2:
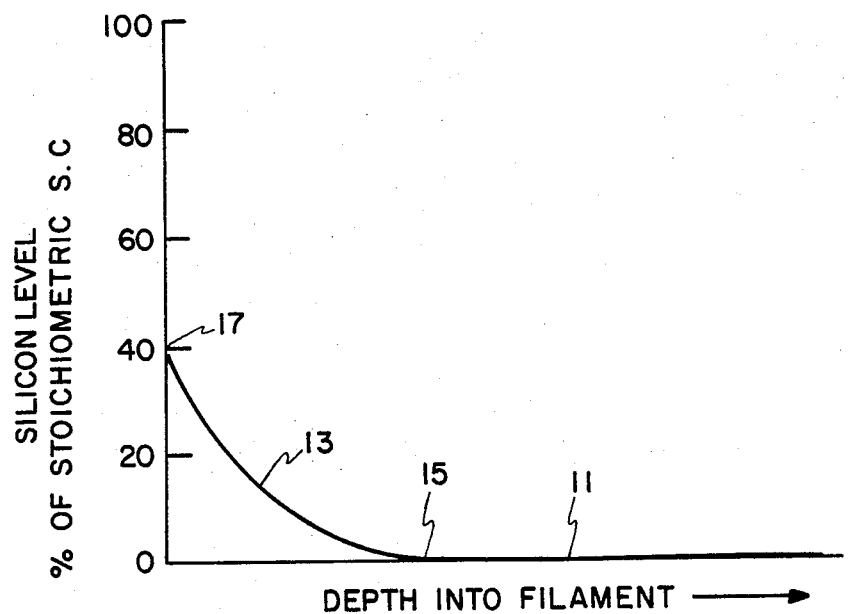
FIG. 2 is an Auger representation of the carbon-rich surface layer.

Referring to FIG. 1, there is shown a cross section of a carbon filament 11 with a carbon-rich surface layer 13 superimposed on the carbon filament 11. The composition of the carbon-rich surface layer 13 is illustrated in the Auger diagram of FIG. 2. The symbol 15 represents the interface between the carbon filament 11 and the carbon-rich surface layer 13. At the exterior surface 17 of the carbon-rich layer 13, the silicon level, as a percentage of stoichiometric silicon carbide, is shown as 40 percent. Another way of expressing this is that the silicon to carbon ratio is 0.4. The silicon to carbon ratio decreases along the continuous curve somewhat as illustrated in FIG. 2 and becomes zero at the interface 15.

The depth of the carbon-rich surface layer is in the order of 0.25 microns ±20 percent. The preferred ratio of silicon to carbon at the exterior surface 17 is within the range of 0.3 to 0.5 with 0.4 having been established as the desired ratio. In its broadest sense the invention covers the deposition of a carbon-rich silicon carbide layer on carbon surfaces where the ratio of silicon to carbon increases continuously in the range of from zero to one. Some variation in depth can be tolerated.

Figure 3:
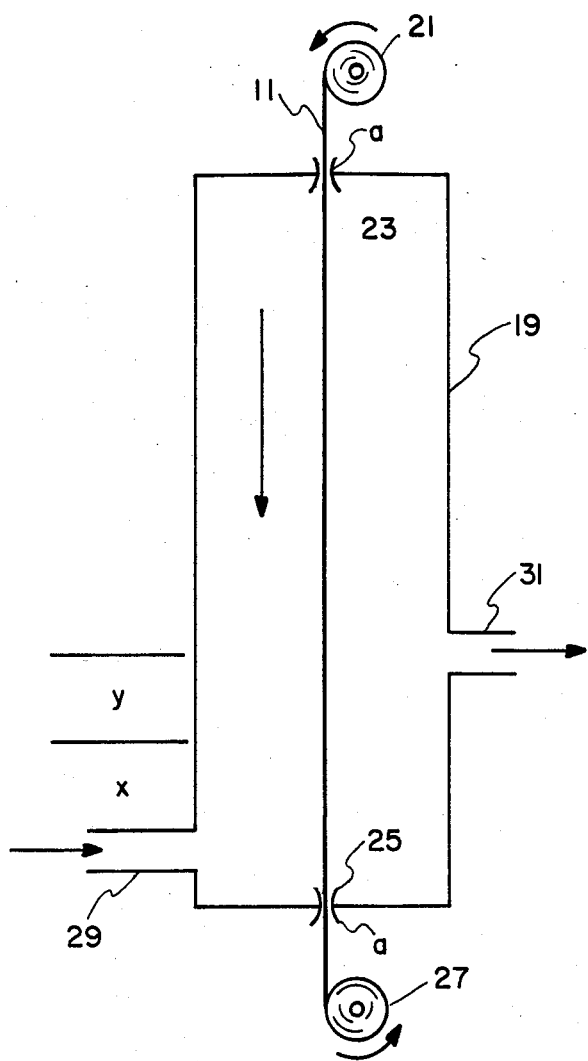
FIG. 3 is a vapor deposition reactor used to illustrate the preferred process for making the carbon-rich surface layer.

A method for constructing the carbon-rich silicon carbide layer on carbon fiber by means of a vapor deposition process is illustrated in FIG. 3. There is provided a reactor 19. The reactor 19 follows the generic form of such reactors described in the numerous patents. One form of such reactor is provided in U.S. Pat. No. 4,068,037. Typically, a carbon fiber 13 is provided on a reel 21. The carbon fiber passes through a mercury contact opening 23 connected to a source of electrical power through terminal a. The fiber then traverses through the reactor and emerges through a mercury contact opening 25 also connected to a source of electrical power through terminal a. The processed carbon fiber 13 is then collected on a take-up reel 27 at the bottom of the reactor 19. The reactor 19 contains an input port 29 and an exit port 31.

The carbon fiber is heated by electrical resistance means through the electrical terminals a—a to terminals 23 and 25 until an appropriate vapor deposition temperature is reached. A typical deposition temperature is in the region of 1200 C. to 1300 C.

To form the carbon-rich silicon carbide layer, a blend of propane and dichlorosilane, together with argon, is supplied to the reactor 19 by means of input port 29. The blend is made to flow counter to the direction of movement of the carbon fiber 13 through the baffle 33 and through the exit port 31.

The preferred composition of the blend is predominantly silane.

Since the dichlorosilane is more reactive than the propane, it will decompose in the region X adjacent to the input port 29 and deposit on the carbon fiber predominantly silicon carbide. By the time the blend of propane and dichlorosilane reaches the region Y, the blend is now predominantly propane, and a lesser amount of silicon carbide, in combination with carbon, is deposited in the region Y. Since the carbon fiber moves in a downward direction, it first reaches region Y where the propane predominates. In its course of travel through region Y and through region X, the amount of silicon carbide, relative to the amount of carbon being deposited on the carbon fiber 13, increases to form the cross section illustrated in FIG. 2.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. A surface treatment for carbon comprising:
   supplying a first surface comprising essentially pure carbon; and
   depositing a single layer of carbon-rich silicon carbide overlying said first surface, the ratio of silicon to carbon of said carbon-rich layer varies continuously from zero at the interface with said first surface to greater than zero on the surface of the carbon-rich layer remote from said interface for enhancing the wettability of the carbon surface and the depth of the carbon-rich silicon layer is 0.25 microns ±20 percent.

2. A filamentary reinforcement for metal matrix composite materials comprising:
   a filamentary reinforcement having a carbon exterior surface with a single carbon-rich silicon carbide overlayer where the ratio of silicon to carbon varies continuously from zero at the interface in the carbon exterior surface of the filamentary reinforcement to a value intermediate zero and one at the exterior surface of the carbon-rich layer for enhancing the wettability of the carbon surface and the depth of the carbon-rich silicon layer is 0.25 microns ±20 percent.

* * * * *